(12) United States Patent
Fujii et al.

(10) Patent No.: US 10,679,794 B2
(45) Date of Patent: Jun. 9, 2020

(54) THIN FILM CAPACITOR AND ELECTRONIC APPARATUS

(71) Applicant: Murata Manufacturing Co., Ltd., Nagaokakyo-shi, Kyoto-fu (JP)

(72) Inventors: Yasuo Fujii, Nagaokakyo (JP); Hiromasa Saeki, Nagaokakyo (JP)

(73) Assignee: MURATA MANUFACTURING CO., LTD., Nagaokakyo-shi, Kyoto-Fu (JP)

( * ) Notice: Subject to any disclaimer, the term of this patent is extended or adjusted under 35 U.S.C. 154(b) by 0 days.

(21) Appl. No.: 16/190,696

(22) Filed: Nov. 14, 2018

(65) Prior Publication Data
US 2019/0080849 A1 Mar. 14, 2019

Related U.S. Application Data

(63) Continuation of application No. PCT/JP2017/025157, filed on Jul. 10, 2017.

(30) Foreign Application Priority Data

Jul. 29, 2016 (JP) ................. 2016-150084

(51) Int. Cl.
*H01G 4/008* (2006.01)
*H01G 4/01* (2006.01)
(Continued)

(52) U.S. Cl.
CPC ............... *H01G 4/33* (2013.01); *H01G 4/008* (2013.01); *H01G 4/01* (2013.01); *H01G 4/236* (2013.01);
(Continued)

(58) Field of Classification Search
CPC .......... H01G 4/008; H01G 4/01; H01G 4/228; H01G 4/33; H01G 4/236; H01G 4/38;
(Continued)

(56) References Cited

U.S. PATENT DOCUMENTS

2006/0196691 A1 9/2006 Ahn et al.
2006/0214205 A1* 9/2006 Baniecki ................ H01G 4/005
257/295

(Continued)

FOREIGN PATENT DOCUMENTS

JP 2006245588 A 9/2006
JP 2007173439 A * 7/2007 ............. H05K 1/162
(Continued)

OTHER PUBLICATIONS

International Search Report issued for PCT/JP2017/025157 dated Sep. 26, 2017.
(Continued)

*Primary Examiner* — Timothy J Thompson
*Assistant Examiner* — Guillermo J Egoavil
(74) *Attorney, Agent, or Firm* — Arent Fox LLP

(57) ABSTRACT

A plurality of first and second capacitor parts and second capacitor parts are formed on opposed main surfaces of a foil shaped conductive substrate to sandwich the conductive substrate. The first and second capacitor parts are respectively coated with insulative protection layers. Terminal electrodes are respectively formed on main surfaces of the protection layers. The terminal electrodes and conductive parts of the first and second capacitor parts are respectively electrically connected via first via conductors and the terminal electrodes and the conductive substrate 1 are electrically connected to second via conductors.

13 Claims, 10 Drawing Sheets

(51) Int. Cl.
  *H01G 4/228* (2006.01)
  *H01G 4/33* (2006.01)
  *H01K 1/16* (2006.01)
  *H05K 1/16* (2006.01)
  *H01G 4/38* (2006.01)
  *H01L 49/02* (2006.01)
  *H05K 3/46* (2006.01)
  *H01G 9/055* (2006.01)
  *H01G 4/236* (2006.01)

(52) U.S. Cl.
  CPC ............... *H01G 4/38* (2013.01); *H01G 9/055* (2013.01); *H01L 28/82* (2013.01); *H05K 1/162* (2013.01); *H05K 3/46* (2013.01); *H01G 4/228* (2013.01)

(58) Field of Classification Search
  CPC .......... H01G 9/04; H01G 9/055; H01G 9/012; H01G 9/048; H01G 9/28; H01G 9/15; H01L 23/12; H01L 28/82; H05K 1/162; H05K 1/16; H05K 1/0231; H05K 3/46; H05K 3/4688
  USPC ........................................................ 174/260
  See application file for complete search history.

(56) References Cited

U.S. PATENT DOCUMENTS

| | | |
|---|---|---|
| 2008/0173993 A1 | 7/2008 | Andry et al. |
| 2008/0199773 A1* | 8/2008 | Deguchi ............... H01M 2/166 429/188 |
| 2011/0171366 A1* | 7/2011 | Ning .................... H01G 9/0036 427/80 |

FOREIGN PATENT DOCUMENTS

| | | |
|---|---|---|
| JP | 2007173439 A | 7/2007 |
| JP | 2008078301 A | 4/2008 |
| JP | 2008177576 A | 7/2008 |

OTHER PUBLICATIONS

Written Opinion of the International Searching Authority issued for PCT/JP2017/025157 dated Sep. 26, 2017.

* cited by examiner

THIN FILM CAPACITOR AND ELECTRONIC APPARATUS

CROSS REFERENCE TO RELATED APPLICATIONS

The present application is a continuation of International application No. PCT/JP2017/025157, filed Jul. 10, 2017, which claims priority to Japanese Patent Application No. 2016-150084, filed Jul. 29, 2016, the entire contents of each of which are incorporated herein by reference.

TECHNICAL FIELD

The present invention relates to a thin film capacitor, and an electronic apparatus having built therein the thin film capacitor.

BACKGROUND ART

Nowadays, various electronic components operated at a high frequency are mounted on an electronic apparatus such as a personal computer or a personal digital assistance. Then, in such a type of electronic apparatus, a wiring substrate with a capacitor built-in type has been proposed in order to effectively absorb high frequency noise.

For example, FIG. 11 of Japanese Patent Application Laid-Open No. 2008-78301 ("Patent Literature 1") proposes a wiring substrate with a built-in capacitor equipped with an aluminum sheet 101 (sheet base material) that is positioned inside the wiring substrate and in which at least one of surfaces thereof is a metal, a dielectric layer 102 positioned on the metal surface of the aluminum sheet 101, and a solid electrolytic capacitor 105 (flat surface type capacitor) composed of a conductive polymer layer 103 and a capacitor electrode layer 104 and positioned on the dielectric layer 102, and equipped with a first conductor 106 that is insulated from the capacitor electrode layer 104 and that reaches the metal surface of the aluminum sheet 101 from a surface of the wiring substrate, a pad 107 for power source (first electrode pad) connected to the first conductor 106 and positioned on the surface of the wiring substrate, a second conductor 108 passing through the aluminum sheet 101 and insulated from the aluminum sheet 101, and a pad 109 for ground (second electrode pad) connected to the second conductor 108 and the capacitor electrode layer 104.

In Patent Literature 1, the foil shaped aluminum sheet 101 is subjected to electrolytic etching in hydrochloric acid aqueous solution to make the surface of the aluminum sheet 101 be roughened, and thereafter the surface is anodized in aqueous solution of ammonium adipate and an oxide film is formed on the surface of the aluminum sheet to thereby form the dielectric layer 102.

This structure provides a low cost wiring substrate with a built-in capacitor that exhibits a large capacity.

However, since the capacitor is formed by the solid electrolytic capacitor 105 having the dielectric layer 102 anodized, although the dielectric layer 102 of a thin film can be obtained, the capacitor has many defects such as insufficient in insulation properties and inferior in reliability. Furthermore, since the dielectric layer 102 is formed by anodization, polar character is applied to the capacitor, resulting in deterioration in usability.

The present invention has been conceived in light of such a circumstance, and an object thereof is to provide a thin film capacitor small in size and large in capacity that is good in usability and large in degree of freedom in design and that can be applied to various use applications, and to provide an electronic apparatus including the thin film capacitor.

BRIEF DESCRIPTION OF THE INVENTION

In order to achieve the above-mentioned objects, in a thin film capacitor according to the present invention, a respective capacitor part is formed on opposed main surfaces of a foil shaped conductive substrate to sandwich the conductive substrate. Each of the capacitor parts includes a porous base in which a fine pore is formed, a dielectric layer formed on a surface predetermined area of the porous base including an inner surface of the pore, and a conductive part formed on the dielectric layer. Each of the capacitor parts is coated with a respective insulating protection layer and a respective terminal electrode is formed on a main surface of each of the protection layers. The thin film capacitor includes a first via conductor electrically connecting the terminal electrode and the conductive part, and a second via conductor electrically insulated from the conductive part and electrically connecting the terminal electrode and the conductive substrate.

This applies no polar character unlike the case where the dielectric layer is formed by anodization like a solid electrolytic capacitor, making it possible to obtain a thin film capacitor good in usability.

Furthermore, in the thin film capacitor of the present invention, it is preferable that the terminal electrode be divided into a plurality of electrode pads electrically insulated from each other, and the plurality of electrode pads include at least a first electrode pad connected to the first via conductor and a second electrode pad connected to the second via conductor.

In this case, it becomes possible to separate the first and the second via conductors on one side of the main surfaces of the conductive substrate and the first and the second conductors on the other side of the main surfaces of the conductive substrate via the conductive substrate 1, which allows to adjust the position of the electrode pad, expanding degree of freedom in design to improve usability.

Furthermore, in the thin film capacitor of the present invention, it is also preferable that a pad distance between the first electrode pad and the second electrode pad differ between one side of the main surfaces of the conductive substrate and another side of the main surfaces of the conductive substrate.

This makes it possible to form the electrode pad at a pad position depending on the positions of a terminal electrode of an electronic component and a land electrode of a wiring substrate even when the thin film capacitor is used, for example, by being interposed between the electronic component and the wiring substrate.

Furthermore, in the thin film capacitor of the present invention, it is preferable that the first electrode pad include an electrode for ground, and the second electrode pad include an electrode for power source.

This makes it possible to make the first electrode pads forming the electrode for ground be separated on one side of the capacitor parts and the other side of the capacitor parts, so that even when used as an intermediate connection layer, for example, noise can be suppressed that propagates from the side of the electronic component to the side of the wiring substrate or from the side of the wiring substrate to the side of the electronic component. Specifically, in a hybrid circuit in which a digital circuit and an analog circuit are mixed, effective noise suppression can be expected.

Furthermore, in the thin film capacitor of the present invention, it is preferable that the first electrode pad include an electrode for ground and an electrode for input, and the second electrode pad include an electrode for output.

Also in this case, like the above description, noise propagation can be effectively suppressed and a capacitor array having three terminals can be provided.

Furthermore, in the thin film capacitor of the present invention, it is preferable that the conductive substrate be divided into a first conductive substrate and a second conductive substrate via an insulating layer, the second via conductor positioned on a main surface of the first conductive substrate, the main surface being on a side opposite to the insulating layer, be electrically connected to the first conductive substrate, and the second via conductor positioned on a main surface of the second conductive substrate, the main surface being on a side opposite to the insulating layer, be electrically connected to the second conductive substrate. In this case, it is preferable that one of the terminal electrodes form an electrode for power source, and another of the terminal electrodes form an electrode for ground.

This makes one of the capacitor parts and the other one of the capacitor parts be connected in parallel to sandwich the conductive substrate, making it possible to doubles the capacitance.

Furthermore, in the thin film capacitor of the present invention, it is preferable that the conductive material and the porous base be formed of a metal material and integrally formed.

Furthermore, in the thin film capacitor of the present invention, it is preferable that the dielectric layer be formed by being accumulated by atomic layer unit.

This makes it possible to obtain a denser dielectric layer, which makes it possible to suppress occurrence of a defect such as anodization in a solid electrolytic capacitor to cause lowering of insulation properties, making it possible to obtain a thin film capacitor good in insulation properties.

Furthermore, in the thin film capacitor of the present invention, it is preferable that the conductive part be formed by being filled inside the pore.

Furthermore, in the thin film capacitor of the present invention, it is also preferable that the conductive part be formed inside the pore along the dielectric layer.

That is, in any of the case where the conductive part is formed by being filled inside the pore and the case where the conductive part is formed inside the pore along the dielectric layer, capacitance is obtained by using a number of pores, making it possible to obtain a thin film capacitor small in size and large in capacity.

Furthermore, in the thin film capacitor of the present invention, it is preferable that the conductive part be formed of any one of a metal material and a conductive compound, and in this case, it is preferable that the conductive compound include a metal nitride and a metal oxynitride.

That is, when the conductive part is formed of a metal material having a low resistance, further reduction is possible of equivalent series resistance (ESR). Furthermore, when the conductive part is formed of a conductive compound such as a metal nitride or a metal oxynitride, it becomes possible to form the conductive part having good uniformity to the inside of the pore.

Furthermore, in the thin film capacitor of the present invention, it is preferable that the dielectric layer have a variation in its film thickness of not more than 10% in an absolute value conversion in which an average film thickness is a reference.

This makes it possible to obtain the conductive part good in uniformity in film thickness over the entire formation area of the conductive part.

Furthermore, an electronic apparatus according to the present invention is an electronic apparatus in which an intermediate connection layer is interposed between an electronic component and a wiring substrate, and the intermediate connection layer is formed by any one of the above-described thin film capacitors.

According to the thin film capacitor of the present invention, a capacitor part is formed on both main surfaces of the conductive substrate having a foil shape to sandwich the conductive substrate. Furthermore, the capacitor part includes the porous base in which the fine pore is formed, the dielectric layer formed in a surface predetermined area of the porous base including the inner surface of the pore, and the conductive part formed on the dielectric layer, and each of the capacitor parts is coated with the protection layer formed of an insulating material and the terminal electrode is formed on a main surface of the protection layer. The thin film capacitor includes the first via conductor formed on electrically connecting the terminal electrode and the conductive part, and the second via conductor electrically insulated from the conductive part and electrically connecting the terminal electrode and the conductive substrate. Accordingly, no polar character is applied unlike the case where the dielectric layer is formed by anodization like a solid electrolytic capacitor, making it possible to obtain a thin film capacitor good in usability.

Furthermore, according to the electronic apparatus of the present invention, an electronic apparatus can be provided in which no polar character is applied to the capacitor part, usability is improved, degree of freedom of the position of the terminal electrode is large, noise propagation from an electronic component or a wiring substrate is suppressed, and various electronic apparatus can be provided capable of doubling capacitance or the like, because in the electronic apparatus, an intermediate connection layer is interposed between the electronic component and the wiring substrate, and the intermediate connection layer is formed by any of the above-described thin film capacitors.

MODE FOR CARRYING OUT THE INVENTION

Next, embodiments of the present invention will be described in detail.

Figure 1:
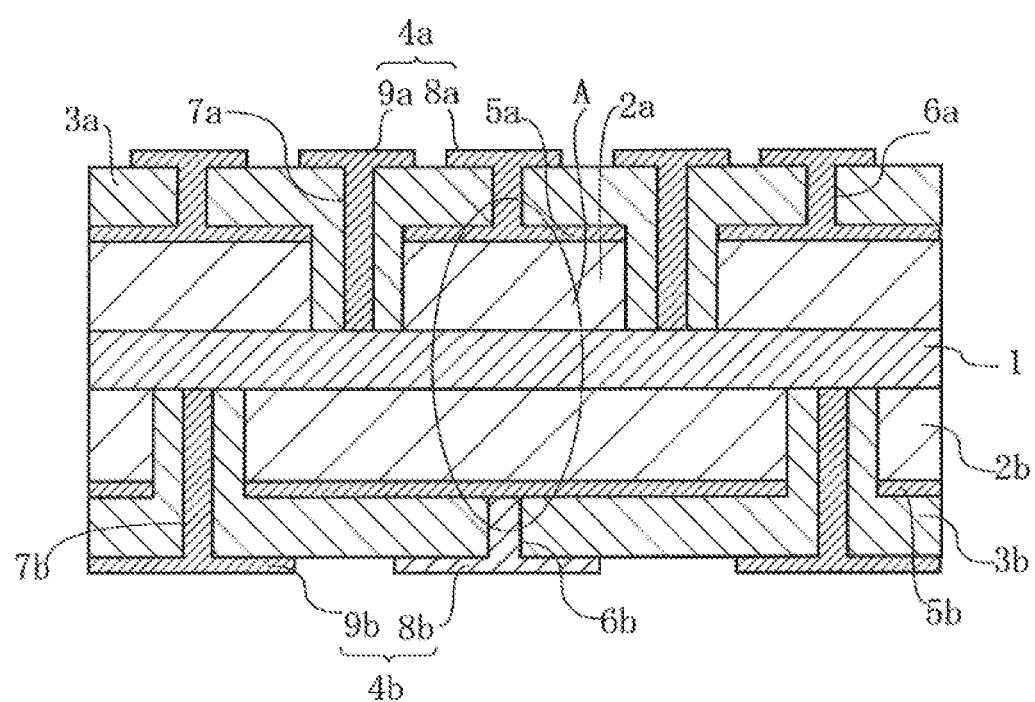
FIG. 1 is a cross-sectional view schematically illustrating an embodiment of a thin film capacitor according to the present invention.

FIG. 1 is a cross-sectional view schematically illustrating a first embodiment of a thin film capacitor according to the present invention.

In the thin film capacitor, first and second capacitor parts 2a and 2b are formed on respective opposed main surfaces of a foil shaped conductive substrate 1 so as to sandwich the conductive substrate 1. Insulating protection layers 3a, 3b, are formed on the first and second capacitor parts 2a and 2b, respectively, and terminal electrodes 4a, 4b are formed on main surfaces of the protection layers 3a, 3b, respectively. First via conductors 6a, 6b pass through respective protection layers 3a, 3b and electrically connect the terminal electrodes 4a, 4b and conductive parts 5a, 5b of the first and second capacitor parts 2a, 2b. Second via conductors 7a, 7b respectively passing through the protection layers 3a, 3b, and electrically connect the terminal electrodes 4a, 4b and the conductive substrate 1. The second via conductors 7a, 7b are electrically insulated from the conductive parts 5a, 5b.

The terminal electrodes 4a, 4b are divided into a plurality of electrode pads respectively including first electrode pads 8a, 8b, and second electrode pads 9a, 9b which are electrically insulated from each other. The first electrode pads 8a, 8b form ground electrodes and are electrically connected with the conductive parts 5a, 5b, respectively. The second electrode pads 9a, 9b form electrodes for power source and are electrically connected to the conductive substrate 1.

Figure 2:
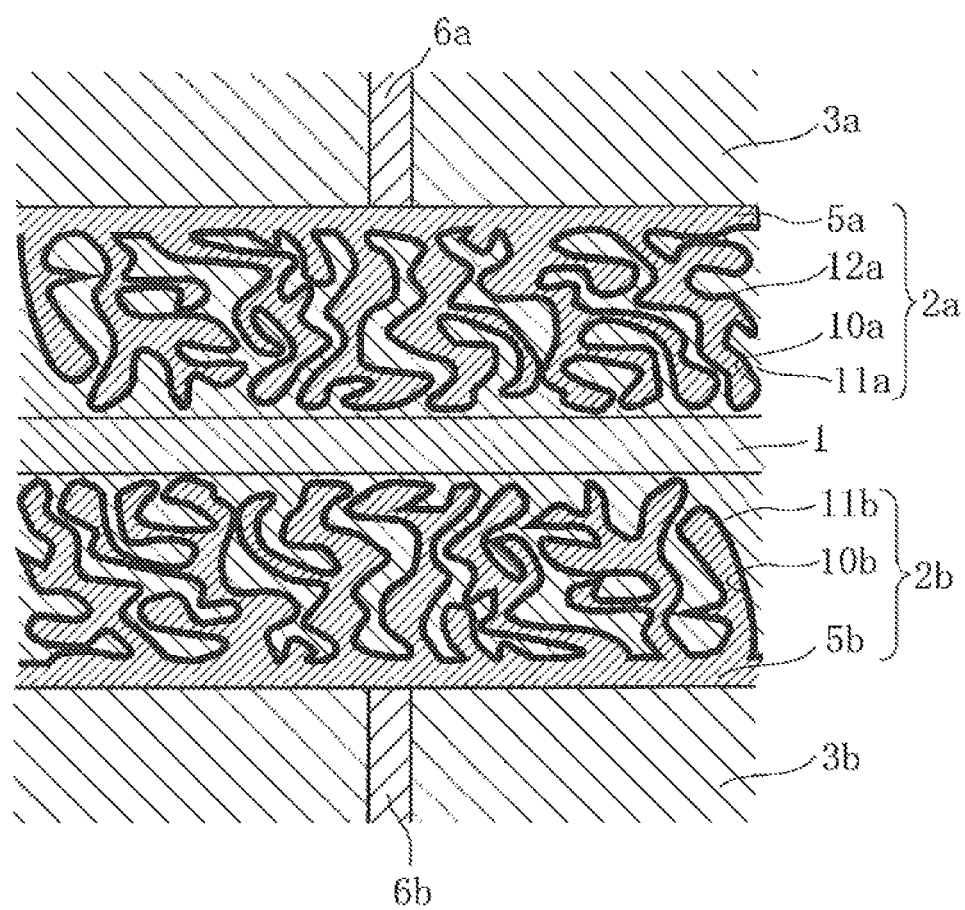
FIG. 2 is an enlarged cross-sectional view illustrating A portion of FIG. 1 in detail.

FIG. 2 is an enlarged cross-sectional view illustrating A portion of FIG. 1 in detail. As shown in this figure, the first capacitor part 2a is formed on the upper main surface of the conductive substrate 1 and the second capacitor part 2b is formed on the lower main surface of the conductive substrate 1 (all as viewed in the orientation shown in FIG. 2).

The first and second capacitor parts 2a, 2b have respective porous bases 11a, 11b in which fine pores 10a, 10b are formed, and are integrally formed with the conductive substrate 1. Dielectric layers 12a, 12b are respectively formed on inner surfaces of the fine pores 10a, 10b, respectively, and a dielectric material is preferably formed in the dielectric layers 12a, 12b, respectively, by atomic layer deposition. Furthermore, the conductive parts 5a, 5b are respectively formed on the dielectric layers 12a, 12b to close the pores 10a, 10b, and the pores 10a, 10b are filled with a material forming the conductive parts 5a, 5b.

Although not particularly limited, porosity of the porous bases 11a, 11b is preferably between 30% and 80%, more preferably between 35% and 65% from the viewpoint of obtaining a desired capacitance.

Note that the manufacturing method of the porous bases 11a, 11b is not particularly limited, and as described below, they can be manufactured by, for example, an etching method, a sintering method, a de-alloying method or the like. Again without limitation, an etched metal foil, a sintered body, a porous metal body or the like manufactured by these manufacturing methods can be used as the porous bases 11a, 11b.

Although not particularly limited, the thickness of the porous bases 11a, 11b are preferably 10 to 500 μm, and more preferably 30 to 300 μm from the viewpoint of providing a desired downsizing while securing mechanical strength.

Although not particularly limited, the thickness of the conductive substrate 1 is preferably 10 to 500 μm from the viewpoint of mechanical strength and reducing its thickness.

The materials of the conductive substrate 1 and porous bases 11a, 11b, are not particularly limited as long as they have conductivity. For example, a metal material such as Al, Ta, Ni, Cu, Ti, Nb or Fe, or an alloy material such as stainless or duralumin can be used. Note that, when used in an electronic apparatus as an intermediate connection layer, it is preferable to use a material having diffusion effect with respect to heat generated from an electronic component, so that it is preferable to use a material having a high heat dissipation such as Al.

Furthermore, the material forming the above-mentioned dielectric layers 12a, 12b is not particularly limited as long as it is a material having insulation properties. For example, AlOX such as Al2O3, SiOX such as SiO2, a metal oxide such as AlTiOX, SiTiOX, HfOX, TaOX, ZrOX, HfSiOX, ZrSiOX, TiZrOX, TiZrWOX, TiOX, SrTiOX, PbTiOX, BaTiOX, BaSrTiOX, BaCaTiOX, SiAlOX, a metal nitride such as AlNX, SiNX, AlScNX, or a metal oxynitride such as AlOXNY, SiOXNY, HfSiOXNY, SiCXOYNZ can be used. Furthermore, from the viewpoint of forming dense film formation, the dielectric layers 12a, 12b do not need to have a crystalline nature, and it is preferable to use a non-crystalline film.

Also, although not particularly limited, it is preferable that the thickness of the dielectric layers 12a, 12b is 3 to 100 nm, and more preferably 10 to 50 nm from the viewpoint of enhancing insulation properties to suppress leak current as well as securing large capacitance.

Although not particularly limited, it is preferable that variation of the film thickness of the dielectric layers 12a, 12b be homogeneous from the viewpoint of obtaining a stable desired capacitance. In the present embodiment, by using atomic layer deposition method described below, variations of the film thickness can be suppressed to be not more than 10% in absolute value conversion in which an average film thickness is a reference.

The material forming conductive parts 5a, 5b is also not particularly limited as long as it has conductivity. For example, Ni, Cu, Al, W, Ti, Ag, Au, Pt, Zn, Sn, Pb, Fe, Cr, Mo, Ru, Pd, Ta, and alloys thereof (e.g., CuNi, AuNi, AuSn), as well as a metal nitride such as TiN, TiAlN, TaN, a metal oxynitride such as TiON, TiAlON, and a conductive polymer such as PEDOT/PSS (poly (3,4-ethylenedioxythiophene)/polystyrene sulfonic acid), polyaniline, polypyrrole, and the like can be used. However, from the viewpoint of filling properties and film forming properties in and on the pores 10a, 10b, a metal nitride or a metal oxynitride is preferable. Note that, when such a metal nitride or a metal oxynitride, or a conductive polymer is used, in order to make electric resistance be further lower resistance, it is preferable that a metal coating such as Cu coating or Ni coating be formed on the surfaces of the conductive parts 5a, 5b by plating method or the like.

Also, although also not particularly limited, it is preferable that the thickness of the conductive parts 5a, 5b be not less than 3 nm and more preferably be not less than 10 nm in order to obtain the conductive parts 5a, 5b having a further lower resistance.

Also, although also not particularly limited, the material forming the protection layers 3a, 3b is not particularly limited as long as it has insulation properties. Materials similar to that of the above-mentioned dielectric layers 12a, 12b (for example, such as SiNX, SiOX, AlTiOX, AlOX) can be used. Alternatively, a resin material such as epoxy resin or polyimide resin, a glass material or the like can be also used.

The formation material and the thickness of the first and second electrode pads 8a, 8b, 9a, 9b (terminal electrodes 4a, 4b) are also not particularly limited as long as they have desired conductive properties. For example, a metal material such as Cu, Ni, Sn, Au, Ag, Pb or alloys thereof can be used, and the thicknesses thereof are preferably 5 to 100 µm, and more preferably 10 to 50 µm.

In the thin film capacitor formed in such a manner, no polar character is applied unlike the case where the dielectric layer is formed by anodization like a solid electrolytic capacitor, making it possible to obtain a thin film capacitor good in usability. Furthermore, accumulating dielectric layers 12a, 12b using an atomic layer deposition forms a dense film, resulting in fewer defects and good insulation properties.

Figure 3:
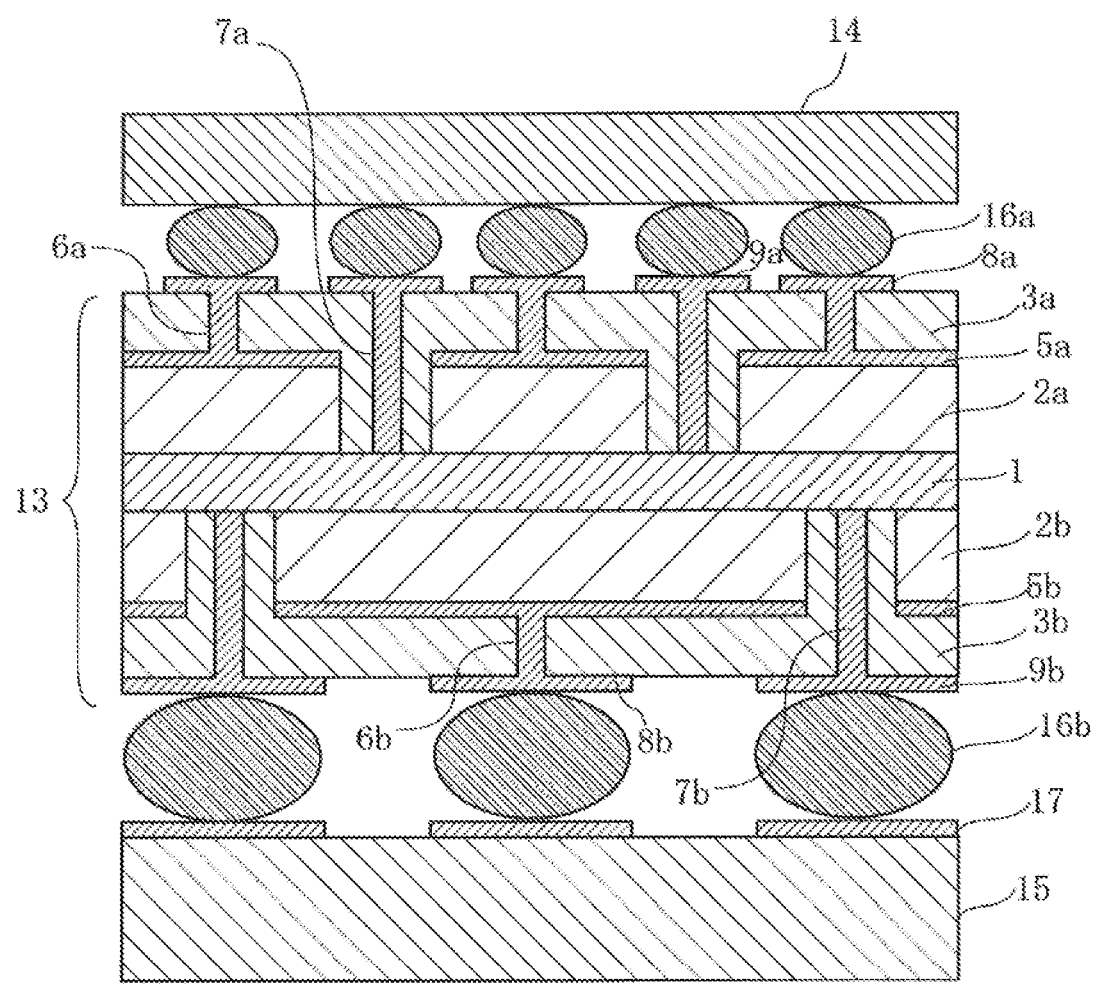
FIG. 3 is a cross-sectional view schematically illustrating an embodiment of an electronic apparatus according to the present invention including the above-mentioned thin film capacitor.

FIG. 3 is a cross-sectional view schematically illustrating an embodiment of an electronic apparatus which incorporates the above-described thin film capacitor.

In the electronic apparatus, the thin film capacitor 13 is interposed between an electronic component (such as a semiconductor component or a ceramic electronic component) and a wiring substrate 15 (such as a mother board) as an intermediate connection layer. First and second electrode pads 8a, 9a formed on the insulating layer 3a are electrically connected to the electronic component 14 via solder balls 16a. The first and second electrode pads 8b, 9b formed on the insulating layer 3b are electrically connected to land electrodes 17 on the wiring substrate 15 via solder balls 16b.

In the electronic apparatus formed in this manner, the first and second via conductors 6a, 7a and the first and second via conductors 6b, 7b are separated via the conductive substrate 1, which makes it possible to adjust the positions of the electrode pads depending on the positions of terminal electrodes of the electronic component 14 and the land electrodes of the wiring substrate 15, resulting in a higher degree of freedom in design and improved usability.

Furthermore, the first ground electrode pads 8a, 8b can be separated to the side of the first capacitor part 2a and the side of the second capacitor part 2b, making it possible to suppress noise propagated from the side of the electronic component 14 to the side of the wiring substrate 15 or from the side of the wiring substrate 15 to the side of the electronic component 14. Specifically, in a hybrid circuit in which a digital circuit and an analog circuit are mixed, by separating the ground electrodes to the side of the electronic component 14 and the side of the wiring substrate 15 as in the embodiment, more effective noise suppression can be expected.

Next, a manufacturing method of the above-mentioned thin film capacitor will be described in detail on the basis of FIG. 4A to FIG. 8B.

First, a conductive base material is prepared in which a porous base is formed on a conductive substrate.

Figure 4A:
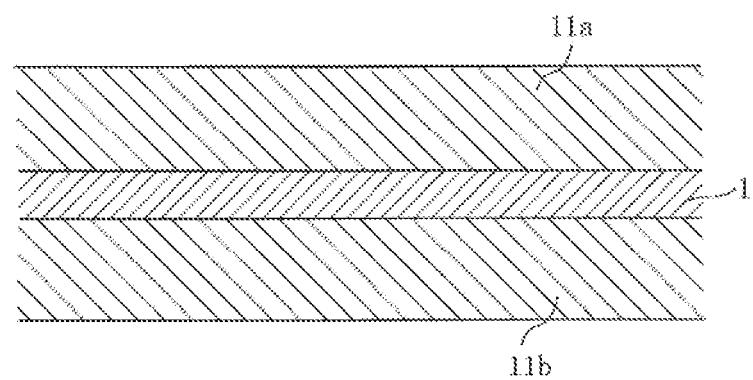
FIGS. 4A through 8B are manufacturing process diagrams schematically illustrating a manufacturing method of the above-mentioned thin film capacitor.
Figure 4B:
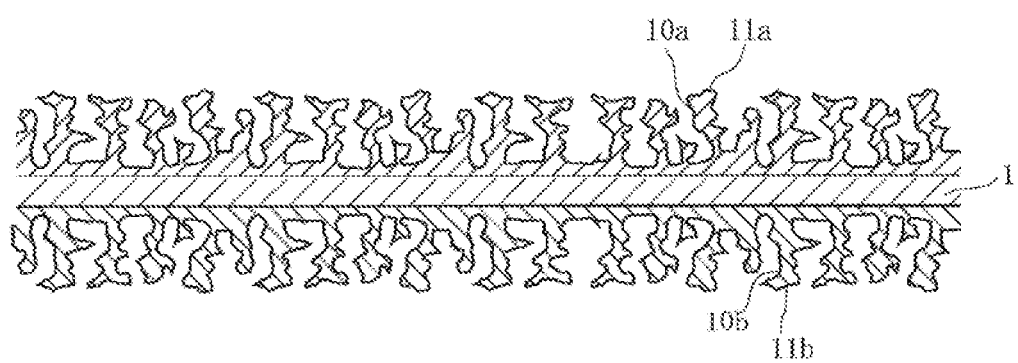

FIG. 4A is a cross-sectional view schematically illustrating the conductive base material and FIG. 4B is a cross-sectional view illustrating FIG. 4A in detail. As best shown in FIG. 4B, fine pores are formed on opposed main surfaces of the foil shaped conductive base material 1. More particularly, porous bases 11a, 11b having fine pores 10a, 10b are respectively formed on respective main surfaces of the conductive substrate 1.

As the porous bases 11a, 11b, a metal etching foil, a metal sintered body, a porous metal body or the like can be used as described above.

The metal etching foil can be manufactured by energizing a predetermined current in any direction of a metal foil such as Al and subjecting the metal foil to etching processing. The metal sintered body can be manufactured, for example, by molding metal powder such as Ta or Ni to have a sheet shape and thereafter heating it at a temperature lower than the melting point of the metal, adjusting sintering condition and the like, and firing the porous sintered body made of a conductive substrate metal plate. Also, the porous metal body can be manufactured by using de-alloying method. That is, only a base metal is dissolved and removed in an electrolyte such as an acid from a two-dimensional alloy of a noble metal and the base metal in electro chemical. Then when the base metal is dissolved and removed, the noble metal not dissolved to be remained forms open pore of nanometer order, and this makes it possible to manufacture a pores metal body. The conductive base material in which the porous bases 11a, 11b are integrally formed on the conductive substrate 1 in this manner is prepared.

Figure 5A:
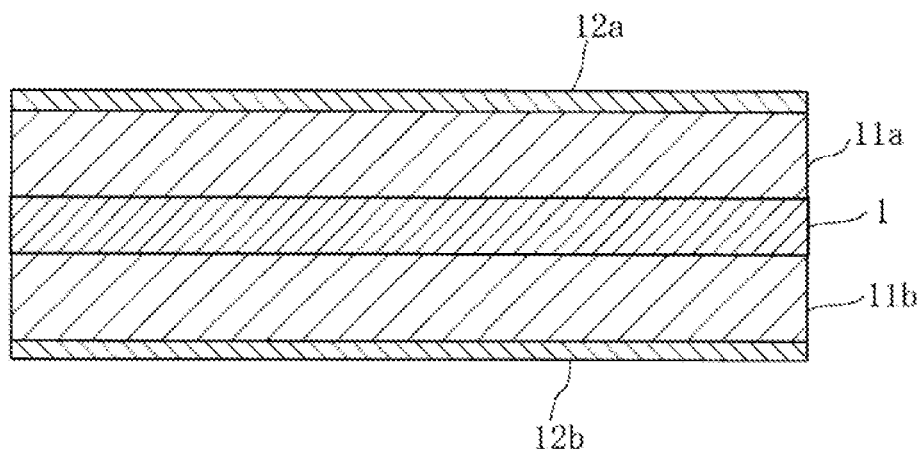
Figure 5B:
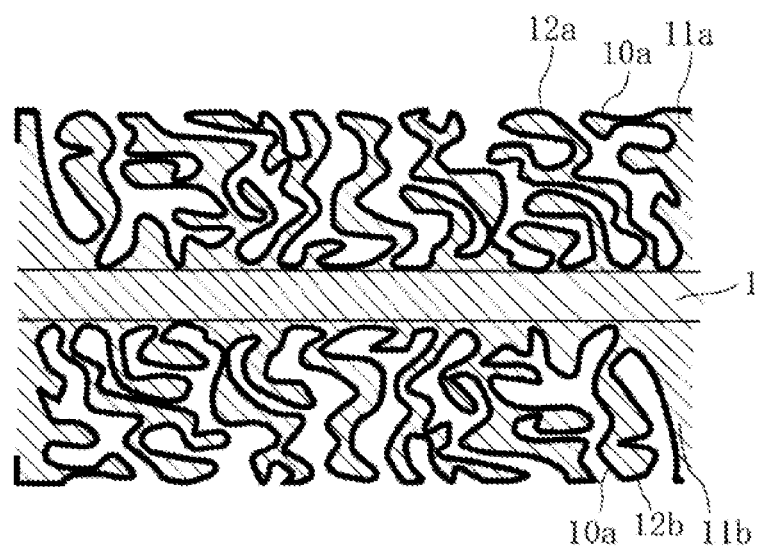

Next, as illustrated in FIG. 5A, the dielectric layers 12a, 12b are formed on the surfaces of the porous bases 11a, 11b, respectively. FIG. 5B is an enlarged cross-sectional view illustrating FIG. 5A in detail.

Specifically, the dielectric layers 12a, 12b are formed on the surface of predetermined areas of the porous bases 11a, 11b, respectively, including inner surfaces of the pores 10a, 10b as illustrated in FIG. 5B.

The forming method of the dielectric layers 12a, 12b is not particularly limited, and can be preformed by chemical vapor deposition (hereinafter, referred to as "CVD"), physical vapor deposition (hereinafter, referred to as "PVD") or the like. However, it is preferable that the dielectric layers 12a, 12b be formed by atomic layer deposition (hereinafter, referred to as "ALD") from the viewpoint of obtaining thin film, which is dense, small in leakage current, and good in insulation properties.

That is, in the CVD method, an organic metal compound that is a precursor and a reaction gas such as water are simultaneously supplied to a reaction chamber to make them react to form a film, so that it is difficult to form the dielectric layers 12a, 12b that are even in their thickness to the depth of the inner surface of the fine pore 9a of nano-order. The same applies to the case of the PVD method using a solid raw material.

In contrast, in the ALD method, after organic metal precursor is supplied to a reaction chamber and chemisorbed, some of the organic metal precursor excessively existing in gas phase is purged for removal, and then the organic metal precursor is made to react with a reaction gas such as water vaper in the reaction chamber, which makes it possible to accumulate a thin film of atomic layer unit in the surface predetermined areas of the porous bases 11a, 11b respectively including the inner surfaces of the pores 10a, 10b. Accordingly, by repeating the above-mentioned processes, thin films are accumulated by atomic layer unit, and this makes it possible to form the dielectric layers 12a, 12b that are even to the depth of the inner surfaces of the pores 10a, 10b, that have a predetermine film thickness, and that is dense and high quality.

By manufacturing the dielectric layers 12a, 12b using the ALD method in this manner, it is possible to obtain dielectric layers 12a, 12b thin films that are dense, have a small leakage current and have good insulation properties, making it possible to obtain a thin film capacitor having a large capacitance that has stable capacitance and good reliability.

Figure 6A:
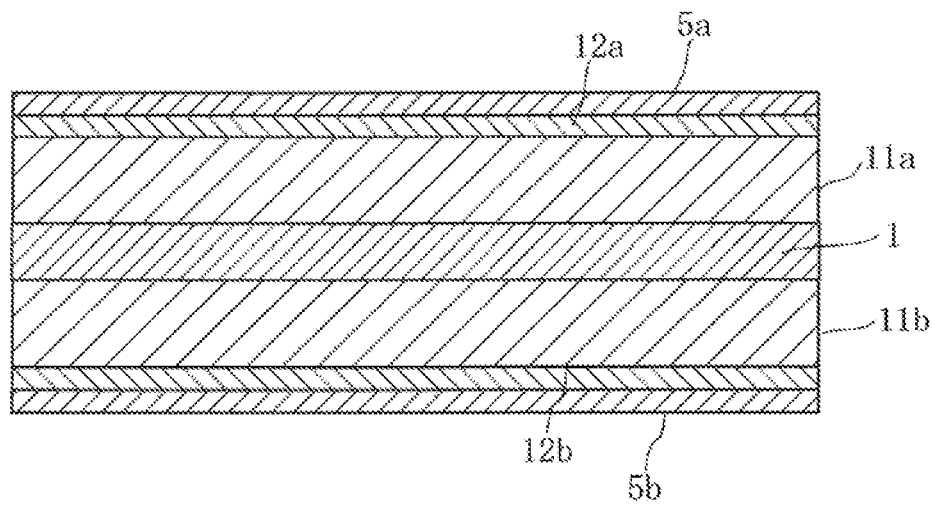
Figure 6B:
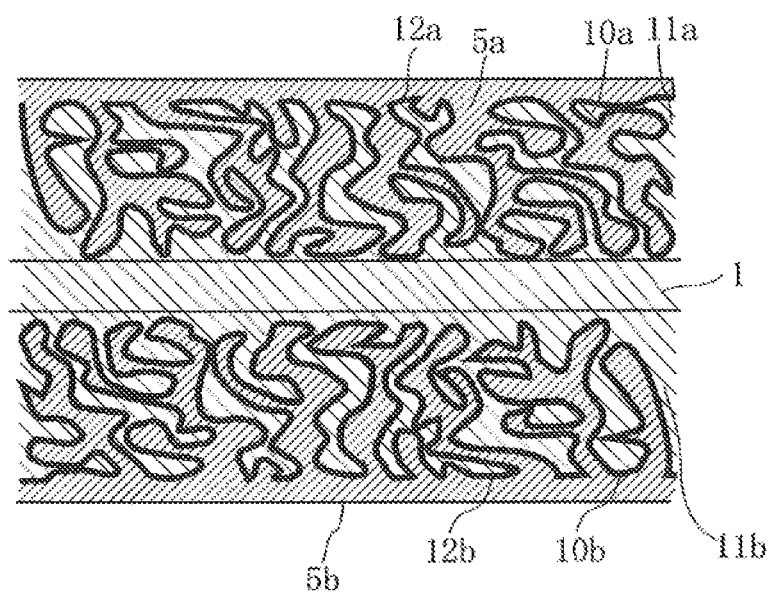

Next, as illustrated in FIG. 6A, the conductive parts 5a, 5b are formed on the surfaces of the dielectric layers 12a, 12b, respectively. FIG. 6B is an enlarged cross-sectional view illustrating FIG. 6A in detail.

Specifically, as illustrated in FIG. 6B, the conductive parts 5a, 5b are filled inside the pores 10a, 10b to be in contact with the dielectric layers 12a, 12b, respectively, and to be formed on predetermined areas of the surface of the porous bases 11a, 11b.

The forming method of the conductive parts 5a, 5b is also not particularly limited, and for example, CVD method, plating method, bias sputtering method, sol-gel method, conductive polymer filling method or the like can be used. However, in order to obtain conductive parts 5a, 5b that are dense and with a high degree of precision, it is preferable to use the ALD method superior in film-forming properties like the dielectric layers 12a, 12b. Alternatively, for example, conductive layers may be manufactured by ALD method on the surfaces of the dielectric layers 12a, 12b respectively formed inside the pores 10a, 10b, and a conductive material may be filled by a method such as CVD method, plating method or the like on the conductive layers to thereby form the conductive parts 5a, 5b.

Figure 7A:
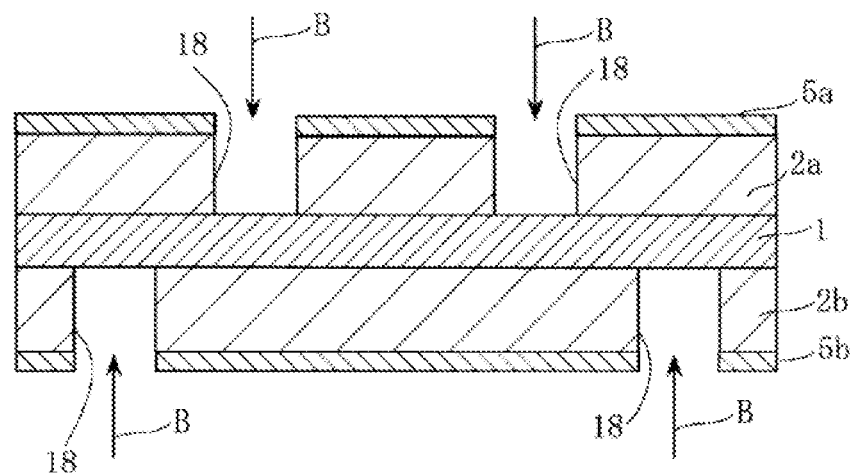

Next, as illustrated in FIG. 7A, laser is irradiated in the direction of arrow B at predetermined portions of the porous bases 11a, 11b to form grooves 18, obtaining the first and second capacitor parts 2a, 2b.

Figure 7B:
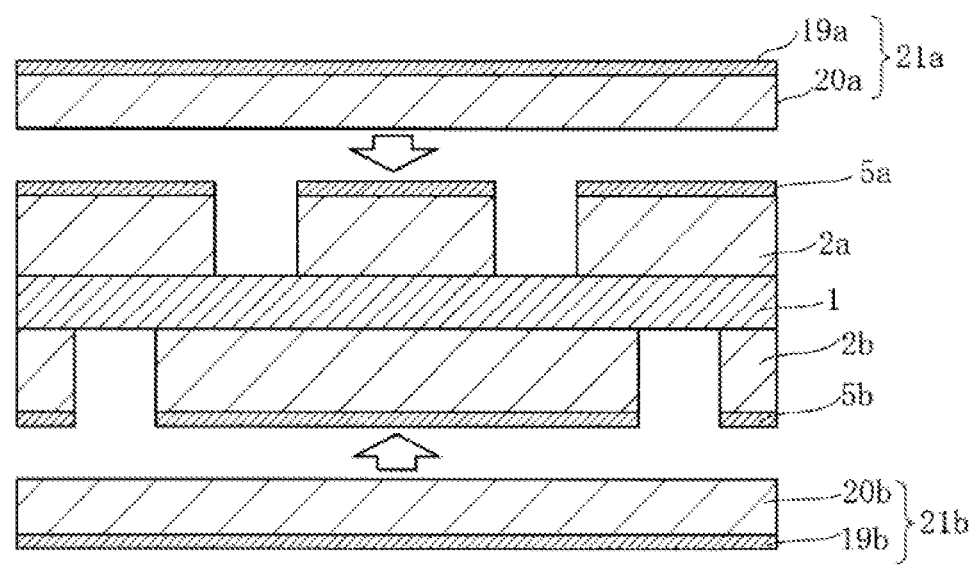
Figure 8A:
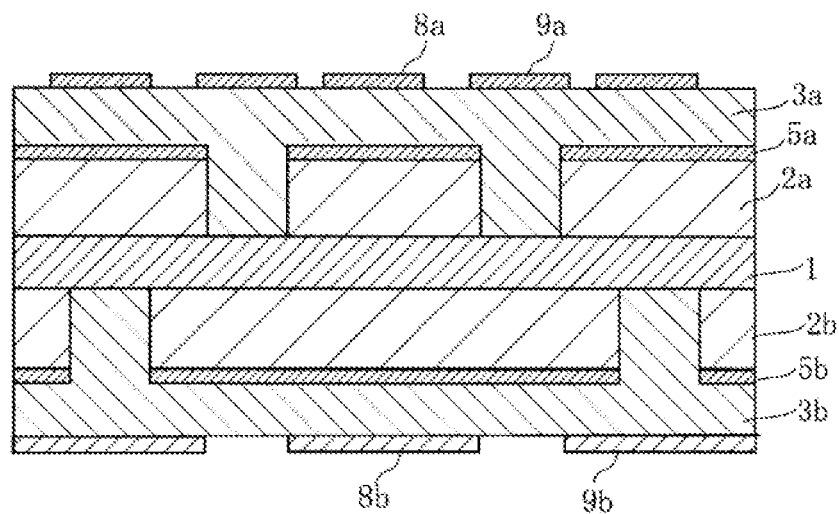
Figure 8B:
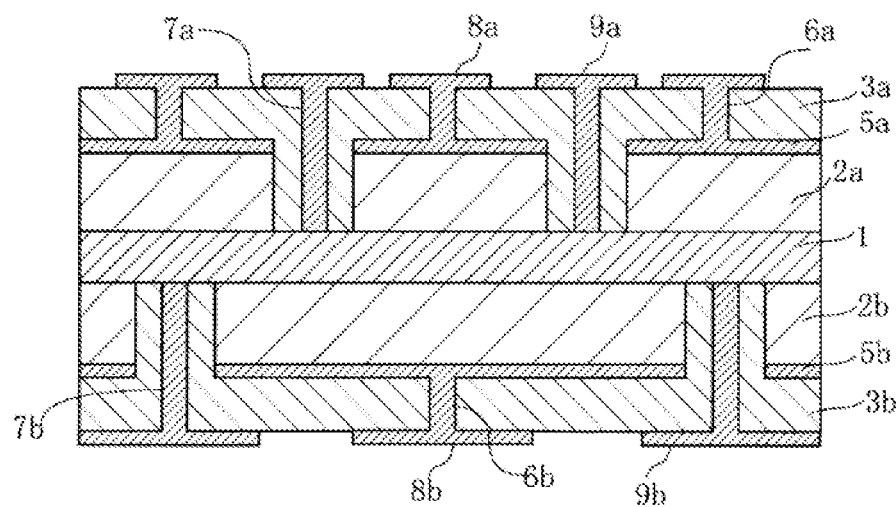

Next, as illustrated in FIG. 7B, base materials 21a, 21b are prepared. The base material 21a includes an interlayer insulating material 20a which is pasted on a main surfaces of the electrode layer 19a. The base material 21b includes an interlayer insulating material 20b which is pasted on a main surfaces of the electrode layer 19b. Then, the base materials 21a 21b and the conductive parts 5a, 5b are respectively pasted each other such that the interlayer insulating materials 20a, 20b are respectively opposed to the conductive parts 5a, 5b of the first and second capacitor parts 2a, 2b. Consequently, the interlayer insulating materials 20a, 20b flow into the grooves 18, and as illustrated in FIG. 8A, the groove 18 (FIG. 7A) are filled with the interlayer insulating materials 20a, 20b to form the protection layers 3a, 3b.

Although the interlayer insulating materials 20a, 20b are not particularly limited, a sheet containing liquid resin having adhesion properties can be used. For example, liquid epoxy-based resin such as glass epoxy resin, liquid polyimide resin, carbon fiber-based resin, polyimide-based resin or the like can be used.

Thereafter, the electrode layers 19a, 19b (FIG. 7B) are subjected to patterning using photolithography technique or the like to manufacture the first electrode pads 8a, 8b, and the second electrode pads 9a, 9b.

Thereafter, via holes are formed by irradiating laser light at predetermined portions of the first electrode pads 8a, 8b and the second electrode pads 9a, 9b, and a conductive material such as Cu is filled in the via holes to form the first via conductors 8a, 8b, and the second via conductors 9a, 9b to thereby manufacture a thin film capacitor.

In this manner, in the first embodiment, polar character is not applied unlike the case where dielectric layers are formed by anodization like a solid electrolytic capacitor, making it possible to obtain a thin film capacitor good in usability. Furthermore, accumulating the dielectric layers 12a, 12b by an atomic layer unit densely forms films, resulting in less defect and good in insulation properties.

Since, the first and second via conductors 6a, 7a and the first and second via conductors 6b, 7b are separated via the conductive substrate 1, the position of the electrode pad can be adjusted as a function of the position of the electrode of connection partner. This extends the degree of design freedom and improves usability. It also makes it possible to effectively suppress propagation of noise between with the connection partner.

Furthermore, when a metal material such as Al having high heat dissipation is used as the conductive substrate 1 including the porous bases 11a, 11b, heat generated from an electronic component is spread to the entire from the thin film capacitor, which makes it possible to improve heat dissipation efficiency.

Figure 9:
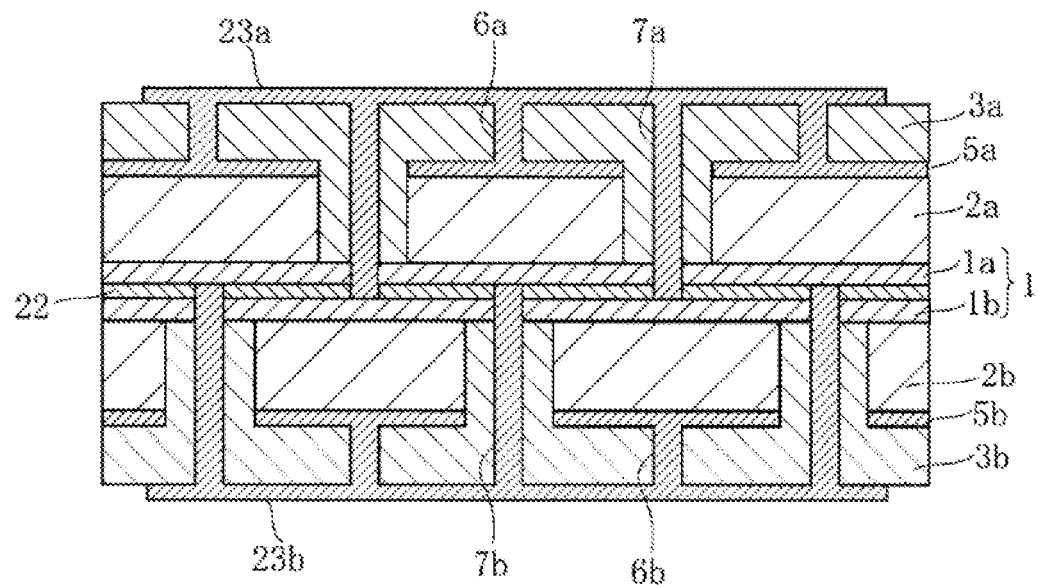
FIG. 9 is a cross-sectional view schematically illustrating a second embodiment of a thin film capacitor according to the present invention.

FIG. 9 is a cross-sectional view schematically illustrating a second embodiment of a thin film capacitor according to the present invention.

Like the first embodiment, the thin film capacitor of the second embodiment includes the first and second capacitor parts 2a, 2b, the protection layers 3a, 3b, the first via conductors 6a, 6b, and the second via conductors 6b, 7b, and the first via conductors 6a, 7b that are respectively connected to the conductive parts 5a, 5b, and the second via conductors 6b, 7b are respectively connected to the conductive substrate 1.

However, in the second embodiment, the conductive substrate 1 is divided into first and second conductive substrates 1a and 1b by an insulating layer 22. In this embodiment, the first capacitor part 2a and the second capacitor part 2b are connected in parallel (rather than in series as in the first embodiment).

Specifically, the conductive substrate 1 is divided into first and second conductive substrates 1a and 1b by the insulating layer 22. A second via conductor 7a is formed to extend from the upper surface of the protective layer 3a (as viewed in FIG. 9) to an upper surface of the second conductive substrate 1b. The second via conductor 7a also passes through the first conductive substrate 1a such that it is conductively coupled to both the first and second conductive substrates 1a and 1b.

A terminal electrode 23a is formed on the top surface of the protection layer 3a and is electrically connected to both the first and second via conductors 6a and 7a.

A second via conductor 7b is formed to extend from the lower surface of the protective layer 3b (as viewed in FIG. 9) to a lower surface of the first conductive substrate 1a. The second via conductor 7b also passes through the second conductive substrate 1b such that it is conductively coupled to both the first and second conductive substrates 1a and 1b.

A terminal electrode 23b is formed on the lower surface of the protection layer 3a (again as viewed in FIG. 9) and is electrically connected to both the first and second via conductors 6b and 7b.

In the second embodiment, the terminal electrode 23a preferably forms an electrode for power source and the terminal electrode 23b preferably forms an electrode for ground, which causes the first and second capacitor parts 2a and 2b to be connected in parallel. This doubles the capacitance.

The thin film capacitor of the second embodiment can be manufactured by a method and procedure similar to those of the first embodiment. That is, first, a conductive base material is prepared in which the porous bases 11a, 11b are formed on the both main surfaces of the conductive substrates 1a, 1b. Then, after the first and second capacitor parts 2a, 2b are manufactured by the method and procedure similar to those of the first embodiment, liquid epoxy-based resin such as glass epoxy resin and adhesive interlayer insulating material such as polyimide resin are applied on the conductive substrates 1a, 1b to paste the conductive substrate 1a and the conductive substrate 1b with each other. Then, the protection layers 3a, 3b, the first and second via conductors 6a, 7a, 6b, 7b, and the like are manufactured by the method and procedure similar to those of the first embodiment, which makes it possible to manufacture the thin film capacitor.

Figure 10:
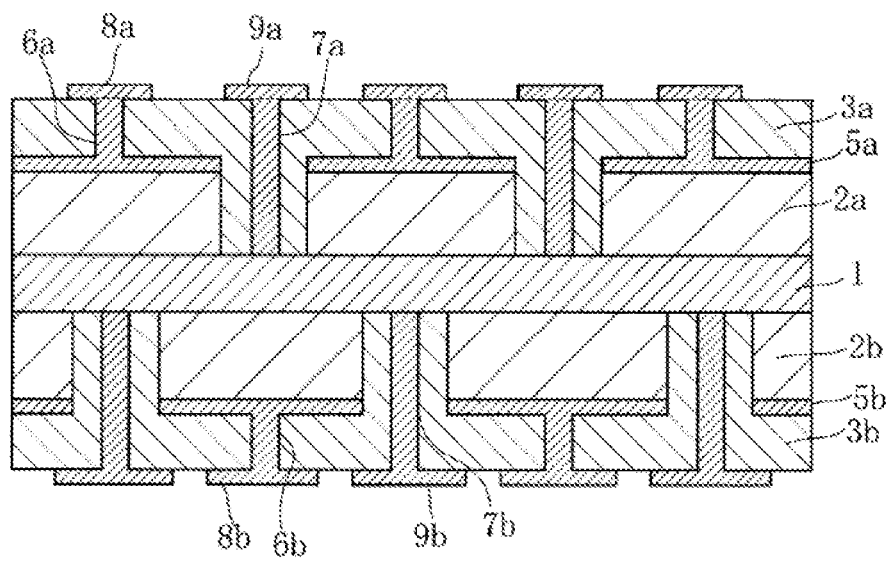
FIG. 10 is a cross-sectional view schematically illustrating a third embodiment of a thin film capacitor according to the present invention.
Figure 11:
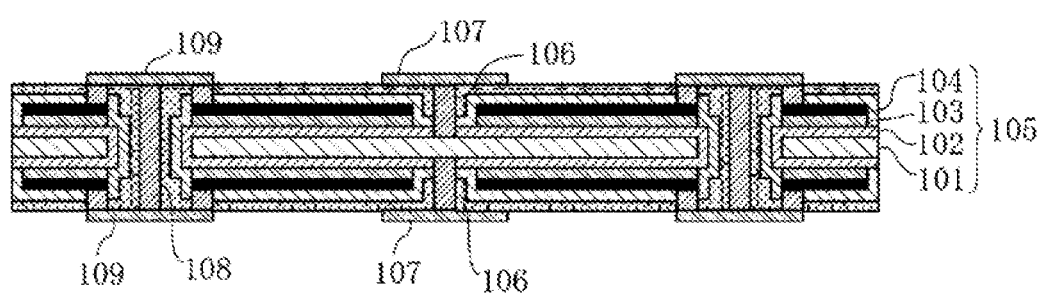
FIG. 11 is a cross-sectional view of a wiring substrate with a capacitor built-in type described in Patent Literature 1.

FIG. 10 is a cross-sectional view schematically illustrating a third embodiment of a thin film capacitor according to the present invention.

Although having the structure similar to that of the first embodiment, the third embodiment connects the first via conductor 6a to the first electrode pad 8a which is used as a ground electrode and connects the first via conductor 6b to the first electrode pad 8b which is used as an output electrode for output on the side of the second capacitor part 2b. This makes it possible to provide a thin film capacitor having three terminals.

In this manner, the present thin film capacitor has wide degree of design freedom and high performance characteristics, and various embodiments are possible depending on its use application, required performance or the like.

Note that the present invention is not limited to any of the above-mentioned embodiments. In the above-mentioned embodiments, although a case is described in which terminal electrodes are used as the electrode for ground, the electrode for power source or the electrode for input and the electrode for output, it goes without saying that effects similar to those described above can be obtained also in the case where one of electrode pad among plurality of electrode pads is used as an electrode for signal.

Also, in each of the above-mentioned embodiments, although the conductive parts 5a, 5b are respectively filled in the dielectric layers 12a, 12b formed on the pores 10a, 10b, the conductive parts 5a, 5b may be respectively formed along the dielectric layers 12a, 12b with a film thickness substantially equal to that of the dielectric layers 12a, 12b.

Also, in each of the above-mentioned embodiments, although the plurality of capacitor parts 2a, 2b are formed on opposite the main surfaces of the conductive substrate 1 to sandwich the conductive substrates 1, the same applies to the case where a single capacitor part 2a and a single capacitor part 2b are formed.

Also, the manufacturing procedure illustrated in the above-mentioned embodiments is an example, so that the manufacturing procedure is not limited thereto and can be modified.

A thin film capacitor small in size and large in capacity can be provided that becomes an alternative to the conventional thin film capacitor such as a solid electrolytic capacitor. This thin film capacitor has a wide degree of freedom in design and high performance, and can be mounted on various types of electronic apparatuses.

DESCRIPTION OF REFERENCE SYMBOLS

1: conductive substrate
2a: first capacitor part
2b: second capacitor part
3a, 3b: protection layer
5a, 5b: conductive part
4a, 4b: terminal electrode
6a, 6b: first via conductor
7a, 7b: second via conductor
8a, 8b: first electrode pad
9a, 9b: second electrode pad
10a, 10b: pore
11a, 11b: porous base
12a, 12b: dielectric layer
22: insulating layer
23a, 23b: terminal electrode

The invention claimed is:

1. A thin film capacitor comprising:
(a) first and second capacitor parts located on first and second opposed main surfaces of a foil shaped conductive substrate so as to sandwich the conductive substrate;
(b) the first capacitor part including:
(1) a first conductive porous base having first pores on a surface thereof;
(2) a first dielectric layer covering at least some of the first pores; and
(3) a first conductive part located on the first dielectric layer;
(c) the second capacitor part including:
(1) a second conductive porous base having second pores on a surface thereof;
(2) a second dielectric layer covering at least some of the second pores; and
(3) a second conductive part located on the second dielectric layer;
(d) first and second insulating protection layers located on the first and second conductive parts, respectively;
(e) first and second terminal electrodes located on a main surface of the first and second insulating protection layers, respectively;
(f) a first via conductor electrically connecting the first terminal electrode and the first conductive part; and
(g) a second via conductor electrically connecting the first terminal electrode and the conductive substrate,
wherein:
the first terminal electrode is divided into a plurality of electrode pads which are electrically insulated from each other;
the plurality of electrode pads includes a first electrode pad connected to the first via conductor and a second electrode pad connected to the second via conductor; and
a pad distance from the first electrode pad to the first conductive part is different than a pad distance from the second electrode pad to the first main surface of the foil shaped conductive substrate.

2. The thin film capacitor according to claim 1, wherein the first and second conductive porous base materials are metallic and are integrally formed with the conductive substrate.

3. The thin film capacitor according to claim 1, wherein the first and second conductive parts fill the first and second pores that are covered by the first and second dielectric layers, respectively.

4. The thin film capacitor according to claim 1, wherein the first and second conductive parts are formed of a metal material.

5. The thin film capacitor according to claim 1, wherein the first and second conductive parts are formed of a conductive compound.

6. The thin film capacitor according to claim 5, wherein the conductive compound includes a metal nitride and a metal oxynitride.

7. The thin film capacitor according to claim 1, wherein the first and second dielectric layers have a variation in its respective film thicknesses of not more than 10% in an absolute value conversion in which an average film thickness is a reference.

8. A thin film capacitor comprising:
(a) first and second foil shaped conductive substrates layered one on top of the other with an insulating layer there between, each of the conductive substrates having opposed top and bottom main surfaces, the top main surface of the second conductive substrate facing the insulating layer, the bottom main surface of the first main surface facing the insulating layer;
(b) a first capacitor part located on the upper main surface of the first conductive substrate;
(c) a second capacitor part located on the lower main surface of the second conductive substrate;
(d) the first capacitor part including:
   (4) a first conductive porous base having first pores on a surface thereof,
   (5) a first dielectric layer covering at least some of the first pores, and
   (6) a first conductive part located on the first dielectric layer;
(e) the second capacitor part including:
   (4) a second conductive porous base having second pores on a surface thereof,
   (5) a second dielectric layer covering at least some of the second pores, and
   (6) a second conductive part located on the second dielectric layer;
(f) first and second insulating protection layers formed on the first and second conductive parts, respectively; and
(g) first and second terminal electrodes formed on a main surface of the first and second protection layers, respectively;
(h) a first via conductor electrically connecting the first terminal electrode and the first conductive part;
(i) a second via conductor electrically connecting the first terminal electrode and the second conductive substrate;
(j) a third via conductor electrically connecting the second terminal electrode and the second conductive part; and
(k) a forth via conductor electrically connecting the second terminal electrode and the first conductive substrate.

9. An electronic apparatus comprising:
an electronic component;
a wiring substrate;
an intermediate connection layer interposed between the electronic component and the wiring substrate, the intermediate connection layer including a thin film capacitor according to claim 1.

10. An electronic apparatus comprising:
an electronic component;
a wiring substrate;
an intermediate connection layer is interposed between the electronic component and the wiring substrate, the intermediate connection layer including a thin film capacitor according to claim 8.

11. A thin film capacitor comprising:
(a) first and second capacitor parts located on first and second opposed main surfaces of a foil shaped conductive substrate so as to sandwich the conductive substrate;
(b) the first capacitor part including:
   (i) a first conductive porous base having first pores on a surface thereof;
   (ii) a first dielectric layer covering at least some of the first pores; and
   (iii) a first conductive part located on the first dielectric layer;
(c) the second capacitor part including:
   (i) a second conductive porous base having second pores on a surface thereof;
   (ii) a second dielectric layer covering at least some of the second pores; and
   (iii) a second conductive part located on the second dielectric layer;
(d) first and second insulating protection layers located on the first and second conductive parts, respectively;
(e) first and second terminal electrodes located on a main surface of the first and second insulating protection layers, respectively;
(f) a first via conductor electrically connecting the first terminal electrode and the first conductive part; and
(g) a second via conductor electrically connecting the first terminal electrode and the conductive substrate,
wherein:
the first terminal electrode is divided into a plurality of electrode pads which are electrically insulated from each other;
the plurality of electrode pads includes a first electrode pad connected to the first via conductor and a second electrode pad connected to the second via conductor; and
a pad distance from the first electrode pad to the first main surface of the foil shaped conductive substrate is different than a pad distance from the second electrode pad to the second main surface of the foil shaped conductive substrate.

12. A thin film capacitor comprising:
(a) first and second capacitor parts located on first and second opposed main surfaces of a foil shaped conductive substrate so as to sandwich the conductive substrate;
(b) the first capacitor part including:
   (i) a first conductive porous base having first pores on a surface thereof;
   (ii) a first dielectric layer covering at least some of the first pores; and
   (iii) a first conductive part located on the first dielectric layer;
(c) the second capacitor part including:
   (i) a second conductive porous base having second pores on a surface thereof;
   (ii) a second dielectric layer covering at least some of the second pores; and
   (iii) a second conductive part located on the second dielectric layer;
(d) first and second insulating protection layers located on the first and second conductive parts, respectively;
(e) first and second terminal electrodes located on a main surface of the first and second insulating protection layers, respectively;
(f) a first via conductor electrically connecting the first terminal electrode and the first conductive part; and
(g) a second via conductor electrically connecting the first terminal electrode and the conductive substrate,
wherein the first and second conductive parts are formed of a conductive compound that includes a metal nitride and a metal oxynitride.

13. A thin film capacitor comprising:
(a) first and second capacitor parts located on first and second opposed main surfaces of a foil shaped conductive substrate so as to sandwich the conductive substrate;
(b) the first capacitor part including:
   (i) a first conductive porous base having first pores on a surface thereof;
   (ii) a first dielectric layer covering at least some of the first pores; and
   (iii) a first conductive part located on the first dielectric layer;

(c) the second capacitor part including:
  (i) a second conductive porous base having second pores on a surface thereof;
  (ii) a second dielectric layer covering at least some of the second pores; and
  (iii) a second conductive part located on the second dielectric layer;
(d) first and second insulating protection layers located on the first and second conductive parts, respectively;
(e) first and second terminal electrodes located on a main surface of the first and second insulating protection layers, respectively;
(f) a first via conductor electrically connecting the first terminal electrode and the first conductive part; and
(g) a second via conductor electrically connecting the first terminal electrode and the conductive substrate,
wherein the first and second dielectric layers have a variation in its respective film thicknesses of not more than 10% of an absolute value conversion in which an average film thickness is a reference.

* * * * *